United States Patent [19]

Moriizumi

[11] Patent Number: 5,086,398
[45] Date of Patent: Feb. 4, 1992

[54] ELECTRON BEAM EXPOSURE METHOD
[75] Inventor: Koichi Moriizumi, Itami, Japan
[73] Assignee: Mitsubishi Denki Kabushiki Kaisha, Japan
[21] Appl. No.: 497,915
[22] Filed: Mar. 23, 1990
[30] Foreign Application Priority Data Nov. 27, 1989 [JP] Japan ................................. 1-304788

[51] Int. Cl.⁵ .................... G06F 15/60; G06F 15/20
[52] U.S. Cl. .................................. 364/490; 364/488; 250/492.2; 250/398
[58] Field of Search ............... 364/488, 490, 525; 250/398, 492.2

[56]  References Cited
U.S. PATENT DOCUMENTS

| | | | |
|---|---|---|---|
| 4,433,384 | 2/1984 | Berrian et al. | 364/525 |
| 4,482,810 | 11/1984 | Cooke | 364/490 |
| 4,586,141 | 4/1986 | Yasuda et al. | 364/490 |
| 4,607,333 | 8/1986 | Yasutake et al. | 364/490 |
| 4,718,019 | 1/1988 | Fillion et al. | 364/490 |
| 4,789,945 | 12/1988 | Niijima | 364/490 |
| 4,812,962 | 3/1989 | Witt | 364/488 |
| 4,853,870 | 8/1989 | Yasutake et al. | 364/490 |
| 4,950,910 | 8/1990 | Yasuda et al. | 364/490 |
| 4,951,216 | 8/1990 | Mawo | 364/488 |
| 4,964,057 | 10/1990 | Yabe | 364/490 X |
| 4,967,367 | 10/1990 | Piednoir | 364/490 X |
| 5,008,830 | 4/1991 | Moriizumi et al. | 364/488 X |

FOREIGN PATENT DOCUMENTS 57-50433 3/1982 Japan .
59-121837 7/1984 Japan .

OTHER PUBLICATIONS

Mihir Parikh and Donald E. Schreiber, Pattern Partitioning For Enhanced Proximity-Effect Corrections In Electron-Beam Lithography, Sep. 1980, pp. 530-536.

Primary Examiner—Joseph L. Dixon
Attorney, Agent, or Firm—Leydig, Voit & Mayer

[57]  ABSTRACT

An electron beam exposure method incorporating a proximity effect correction for a pattern including large-area drawing patterns and small-area drawing patterns. The method includes dividing each large-area drawing pattern into a plurality of unit patterns and calculating the optimum electron beam exposure for each unit pattern and for each small-area drawing pattern. The calculation includes a proximity effect correction for each unit pattern and each small-area drawing pattern adjacent unit patterns having the same calculated exposures are merged into larger areas and drawing data based on the merged unit patterns, the unit patterns not merged, and the small-area drawing patterns is generated. The pattern is exposed to an electron beam that is controlled in accordance with the drawing data.

3 Claims, 3 Drawing Sheets

ELECTRON BEAM EXPOSURE METHOD

BACKGROUND OF THE INVENTION

1. Field of the Invention

This invention relates to an electron beam exposure method and, in particular, to an exposure method which provides a proximity effect correction when forming high precision patterns.

2. Description of the Related Art

With the recent trend toward very dense semiconductor devices, it has become necessary to correct for the so-called proximity effect when fabricating patterns with very narrow line widths by electron beam exposure. The correction is intended to produce an effective exposure or stored energy per unit area that is uniform in each pattern. In this regard, the following method has been proposed in IBM J. RES. DEVELOP. Vol. 24, No. 5, Sept. 1980.

For instance, when as shown in FIG. 5, a large-area pattern 11 is in the proximity of a small-area pattern 12, sampling points 21 to 37 are established for respectively sections each having a predetermined area. Inn the large-area pattern 11, the sample points 22 to 37 are located around the periphery thereof. Next, initial exposure values are respectively determined for the patterns 11 and 12. The respective stored energies at the sampling points 21 to 37 when exposed in accordance with these exposure values are then evaluated. Afterwards, sampling points of the same evaluation value are gathered together, thus dividing the pattern 11 into division patterns 41 to 48 as shown in FIG. 6.

Afterwards, respective proper exposures to be allocated to the pattern 12 and the division patterns 41 to 48 are calculated. The calculation is performed such that the proper exposures thus calculated will make the respective stored energies at the sampling points 21 to 37 equal to each other. The respective stored energies at the sampling points 21 to 37 when exposed in accordance with these proper exposures are then evaluated. If a sampling point of a different evaluation value exists in a division pattern, it is decided that the section including that sampling point does not belong to this division pattern, with the result that this division pattern is further divided into a number of division patterns including the above-mentioned section as one of them. For instance, if, of the four sampling points 34 to 37 in the division pattern 48, only the sampling point 36 exhibits a different evaluation value, this division pattern 48 is further divided into division patterns 49 to 51, as shown in FIG. 7.

Afterwards, the proper exposures to be respectively allocated to the pattern 12, the division patterns 41 to 47, and 49 to 51 are calculated. The calculation is performed so that the proper exposures obtained will make the respective stored energies at the sampling points 21 to 37 equal to each other.

In this way, the evaluation of stored energies, the division of patterns, and the calculation of proper exposures are repeated until all the sampling points 21 to 37 exhibit the same stored energy. Thus, proximity correction when forming patterns including very narrow line widths can be effected.

The problem with the above-described prior-art method is that the operations of evaluating stored energies, dividing patterns, and calculating proper exposures, have to be repeated many times before all the sampling points 21 to 37 exhibit the same stored energy, As a result, a lot of time has to be spent before the proximity correction is completed.

SUMMARY OF THE INVENTION

This invention has been made with a view to eliminating the above problem. It is accordingly the object of this invention to provide an electron beam exposure method which makes it possible to complete proximity correction in a short time and with high accuracy.

In accordance with this invention, there is provided an electron beam exposure method comprising dividing each large-area drawing pattern into a plurality of unit patterns, calculating the optimum electron beam exposure individually for each unit pattern and each small-area drawing pattern by performing the proximity effect correction for each unit pattern and each small-area drawing patterns, preparing drawing data by connecting those unit patterns which are adjacent to each other and whose, calculated exposures are the same, and exposing the pattern to an electron beam in accordance with the drawing data thus prepared.

DESCRIPTION OF THE PREFERRED EMBODIMENT

An embodiment of this invention will now be described with reference to the accompanying drawings.

Figure 1:
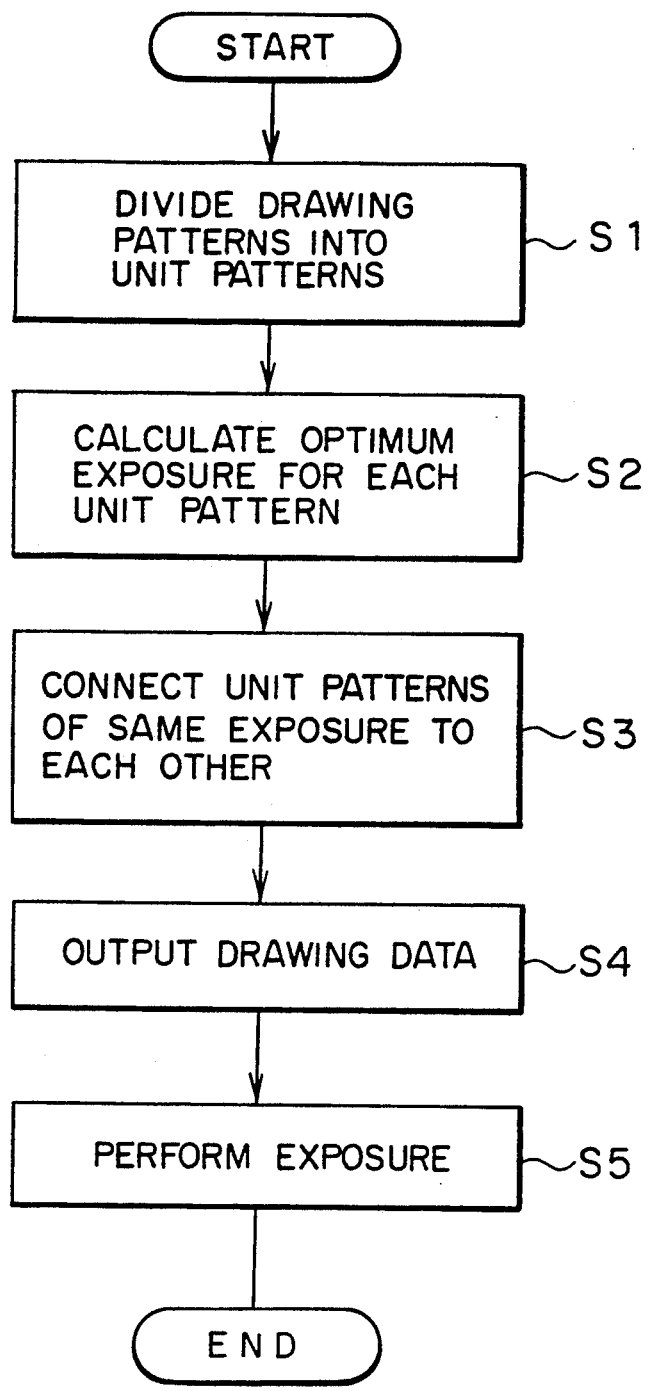
FIG. 1 is a flowchart showing an electron beam exposure method in accordance with an embodiment of this invention.
Figure 2:
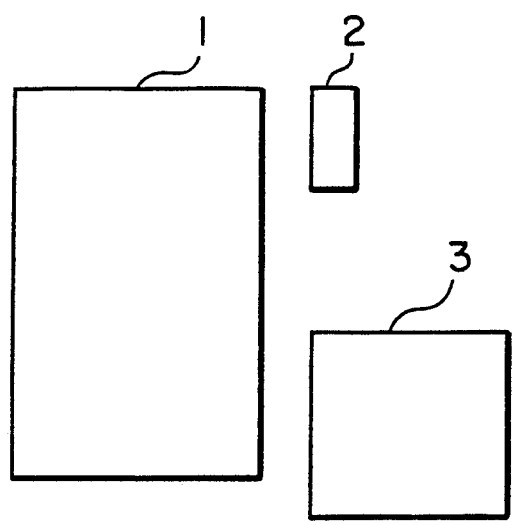
FIGS. 2 to 4 are schematic views showing patterns in this embodiment.
Figure 3:
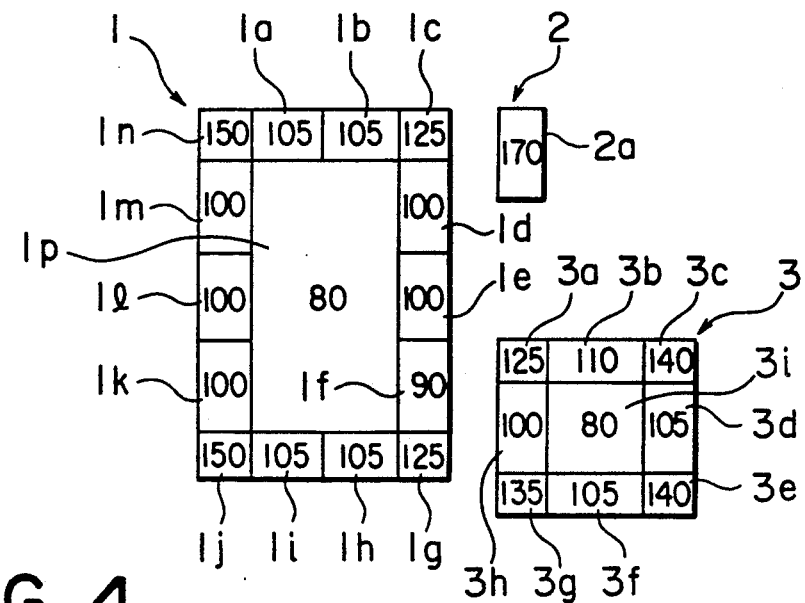

Described first, with reference to the flowchart of FIG. 1, is the formation by electron beam exposure of drawing patterns 1 to 3 as shown in FIG. 2. First, in Step S1, the large-area drawing patterns 1 and 3 are divided into a plurality of unit patterns along their peripheries, respectively. Each unit pattern is 1μm wide and 2μm long. As shown in FIG. 3, the drawing pattern 1 is divided into unit patterns 1a to 1n and a central pattern 1p, and the drawing pattern 3 is divided into unit patterns 3a to 3h and a central pattern 3i. Since the drawing pattern 2 is of the same size as the unit pattern, it is not divided and constitutes itself a unit pattern 2a.

Next, in Step S2, a proximity effect correction is performed for each of the unit patterns 1a to 1n, 2a, and 3a to 3h, calculating optimum electron beam exposures which will render the stored energies of all the unit patterns equal to each other. The values of the exposures thus calculated are shown in the respective unit patterns of FIG. 3. These exposure values are given as ratios in % with respect to a predetermined exposure value. For the central patterns 1p and 3i, which are little affected the proximity effect, a certain exposure value, for example, 80%, is set beforehand. The exposure value for each unit pattern is calculated from simultaneous equations including the exposure for each unit pattern as the unknown and obtaining the stored energy for each unit pattern concerned while taking into account the influence of other unit patterns. The condition for solving these simultaneous equations is that the stored energies for all the unit patterns should be a certain, common amount.

Figure 4:
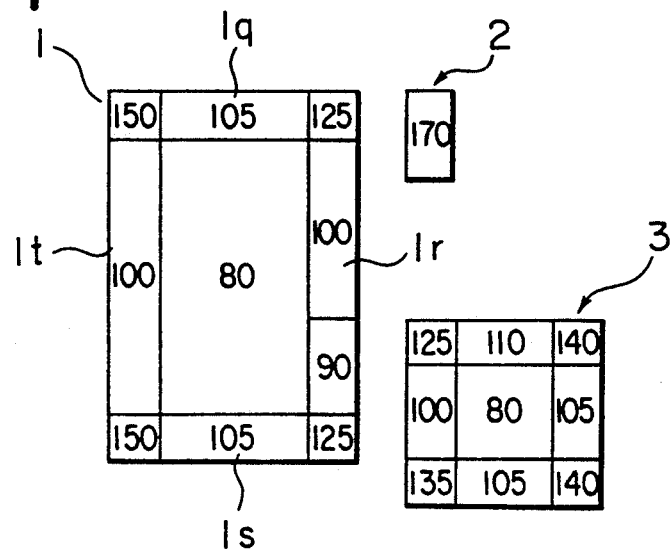
Figure 5:
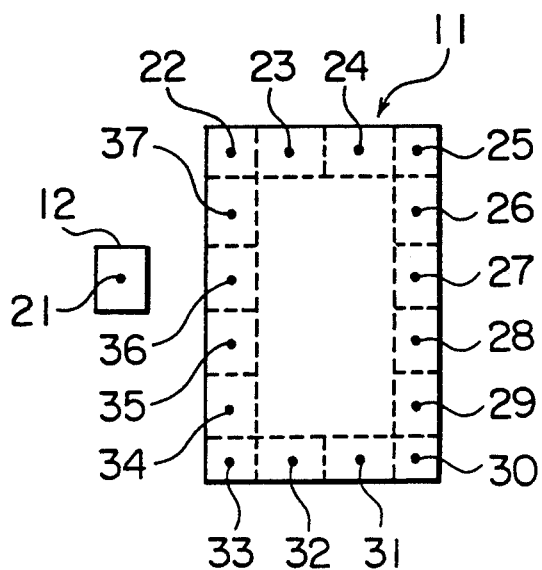
FIGS. 5 to 7 show patterns for illustrating a conventional electron beam exposure method.
Figure 6:
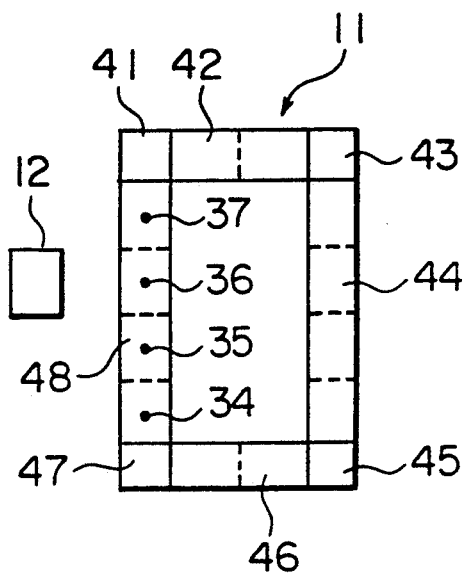
Figure 7:
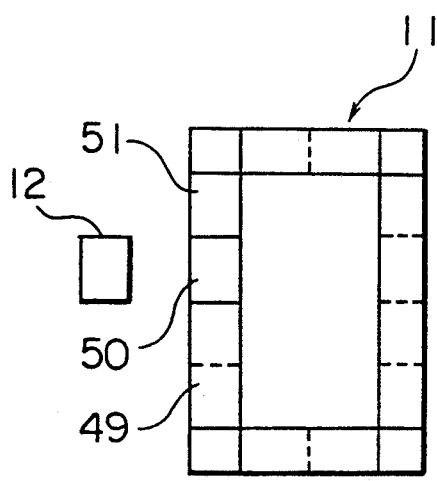

Afterwards, in Step S3, all adjacent unit patterns whose exposures are calculated to be the same are connected to each other to form a single pattern. Thus, as shown in FIG. 4, the unit patterns 1a and 1b are fused into a pattern 1q. Likewise, the unit patterns 1d and 1e are fused into a pattern 1r, the unit patterns 1h and 1i are fused into a pattern 1s, and the unit patterns 1k to 1m are fused into a pattern 1t. As a result, a reduction in the number of patterns occurs. In other words, while in FIG. 3 the drawing patterns 1 to 3 are divided into 25 patterns in all, the number of patterns is reduced to 20 in FIG. 4.

Next, in Step S4, drawing data is prepared from the respective positions and exposures of the patterns shown in FIG. 4. The drawing data thus prepared is supplied to an exposure apparatus (not shown). Then, in Step S5, the exposure apparatus exposes the pattern to the electron beam in accordance with the drawing data.

As described above, drawing patterns are divided into unit patterns, and a proximity effect correction is calculated for each unit pattern so that the optimum exposure determination has only to be made once, thus making it possible to prepare drawing data in a short time and simply. Furthermore, since unit patterns having the same exposure are connected with each other after the proximity effect correction, the number of patterns is reduced, and the quantity of drawing data to be supplied to the exposure apparatus is reduced. This makes it possible to store the drawing data in a relatively small memory and to reduce the exposure time, which helps in turn to improve the throughput.

While in the above-described embodiment the large-area drawing patterns 1 and 3 are divided into unit patterns along their peripheries, the mode of division is not so restricted. For instance, the drawing patterns may also be divided into unit patterns in a grid or only along the longer side thereof. If the proximity effect on a pattern is negligible because no other pattern exists in the vicinity thereof, that pattern need not be divided.

What is claimed is:

1. A method for controlling exposure by an electron beam of a pattern, the pattern including at least one large-area drawing pattern and at least one small-area drawing pattern, the method comprising:
   specifying a pattern including at least one-large area drawing pattern and at least one small-area drawing pattern;
   dividing at least one of the large-area drawing patterns into a plurality of unit patterns;
   calculating electron beam exposure for each unit pattern and each small-area drawing pattern including a proximity effect correction for each unit pattern and each small-area drawing pattern;
   merging adjacent unit patterns for which the respective calculated exposures are the same into larger patterns;
   preparing drawing data for controlling an electron beam to expose the pattern, the drawing data including data for the merged larger patterns formed from unit patterns, for the unit patterns not merged with other unit patterns, and for the small-area drawing patterns; and
   exposing the pattern to an electron beam controlled by the drawing data.

2. The method as claimed in claim 1 including dividing each large-area drawing pattern into a plurality of unit patterns disposed along respective peripheries of the large-area drawing patterns.

3. The method as claimed in claim 1 including dividing each large-area drawing pattern into a plurality of unit patterns disposed on a grid.

* * * * *